US006221727B1

United States Patent
Chan et al.

(10) Patent No.: US 6,221,727 B1
(45) Date of Patent: Apr. 24, 2001

(54) METHOD TO TRAP AIR AT THE SILICON SUBSTRATE FOR IMPROVING THE QUALITY FACTOR OF RF INDUCTORS IN CMOS TECHNOLOGY

(75) Inventors: Lap Chan, San Francisco, CA (US); Johnny Kok Wai Chew, Singapore (SG); Cher Liang Cha, Singapore (SG); Chee Tee Chua, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/385,524

(22) Filed: Aug. 30, 1999

(51) Int. Cl.[7] .................................................. H01L 21/20
(52) U.S. Cl. ...................... 438/381; 438/238; 438/411; 257/531
(58) Field of Search ................................. 438/411, 581; 257/531

(56) References Cited

U.S. PATENT DOCUMENTS

| 5,539,241 | 7/1996 | Abidi et al. | 257/531 |
|---|---|---|---|
| 5,742,091 | 4/1998 | Hébert | 257/531 |
| 5,770,509 | 6/1998 | Yu et al. | 438/381 |
| 5,773,870 | 6/1998 | Su et al. | 257/531 |
| 5,844,299 | 12/1998 | Merrill et al. | 257/531 |
| 5,856,703 | * 1/1999 | Manning | 257/632 |
| 6,081,030 | * 6/2000 | Jaouen et al. | 257/728 |
| 6,140,197 | * 10/2000 | Chu et al. | 438/381 |

* cited by examiner

*Primary Examiner*—Charles Bowers
*Assistant Examiner*—William M. Brewster
(74) *Attorney, Agent, or Firm*—George O. Saile; Rosemary L. S. Pike

(57) ABSTRACT

A new method of fabricating an inductor utilizing air as an underlying barrier in the manufacturing of integrated circuits is described. A field oxide region is formed in and on a semiconductor substrate and then removed whereby a well is left in the semiconductor substrate. A polish stop layer is deposited over the substrate and within the well. The polish stop layer is covered and the well filled with a spin-on-glass layer. The spin-on-glass layer is polished back to the polish stop layer. The said polish stop layer is removed. A first oxide layer is deposited overlying the spin-on-glass layer and the semiconductor substrate and is patterned using an inductor reticle whereby a plurality of openings are made through the first oxide layer to the spin-on-glass layer. All of the spin-on-glass layer within the well is removed through the plurality of openings. Thereafter, a second oxide layer is deposited overlying the first oxide layer and capping the plurality of openings thereby forming an air barrier within the well. A metal layer is deposited overlying the second oxide layer and patterned using the same inductor reticle to form the inductor in the fabrication of an integrated circuit device.

26 Claims, 4 Drawing Sheets

METHOD TO TRAP AIR AT THE SILICON SUBSTRATE FOR IMPROVING THE QUALITY FACTOR OF RF INDUCTORS IN CMOS TECHNOLOGY

BACKGROUND OF THE INVENTION (1) Field of the Invention

The invention relates to a method of forming an inductor in the fabrication of integrated circuits, and more particularly, to a method of forming a high quality inductor using air as a barrier in the manufacture of integrated circuits.

(2) Description of the Prior Art

The integration of radio frequency (RF) integrated circuits on silicon is one of the greatest challenges for the growing markets of wireless communications. The incorporation of RF inductors on silicon without sacrificing the quality factor (Q) due to substrate losses has been researched heavily in recent years. Some of the techniques include: (i) selectively etching out silicon under the inductor by micro-machining, (ii) employing multi-metal layer of aluminum interconnects or copper damascene interconnects, (iii) using a high resistivity silicon substrate, (iv) employing a biased well underneath a spiral inductor, (v) inserting various types of patterned ground shield between the spiral inductor and the silicon substrate, and (vi) increasing the thickness of the interlayer dielectric. This is not an exhaustive listing. The common objectives of all of these techniques are: 1) to enhance the Q value of the inductor and 2) to increase the self-resonance frequency so that the usable frequency range of the inductor is widened.

The self-resonance caused by the parasitic capacitance of the spiral inductor to the silicon substrate will limit the use of these inductors at high frequencies. The increasing series spreading resistance will degrade the Q factor. This impacts the usefulness of integrated spiral inductors implemented on silicon substrates. These problems can be overcome if the area under the inductor is made to appear locally insulating by selectively removing the underlying silicon resulting in inductors "hanging" in air. Air, which has the lowest dielectric constant, is the most ideal barrier. However, micromachining, used to etch away the silicon under the inductor, is complex and is not compatible with any normal process flow. It is desired to utilize air as a barrier in a process that is implemented easily and is compatible with any process flow with minimal changes.

U.S. Pat. No. 5,539,241 to Abidi et al shows a method of etching out a pit under an inductor during CMOS processing. U.S. Pat. No. 5,844,299 to Merrill et al shows an inductor formed over a pit containing silicon oxide. U.S. Pat. No. 5,742,091 to Hebert et al teaches deep trenches filled with a low dielectric constant material. U.S. Pat. No. 5,773,870 to Su et al discloses backside etching of the substrate under an inductor. U.S. Pat. No. 5,770,509 to Yu et al teaches another inductor process.

SUMMARY OF THE INVENTION

A principal objective of the present invention is to provide an effective and very manufacturable method of forming a high quality inductor in the fabrication of integrated circuit devices.

Another objective of the invention is to provide a method of fabricating an inductor utilizing air as an underlying barrier in the manufacture of integrated circuits.

A further objective of the invention is to provide a method of fabricating an inductor having an air well within the silicon substrate thereunder.

In accordance with the objectives of this invention a new method of fabricating an inductor utilizing air as an underlying barrier in the manufacture of integrated circuits is achieved. A field oxide region is formed in and on a semiconductor substrate and then removed whereby a well is left in the semiconductor substrate. A polish stop layer is deposited over the substrate and within the well. The polish stop layer is covered and the well filled with a spin-on-glass layer. The spin-on-glass layer is polished back to the polish stop layer. The polish stop layer is removed. A first oxide layer is deposited overlying the spin-on-glass layer and the semiconductor substrate and is patterned using an inductor reticle whereby a plurality of openings are made through the first oxide layer to the spin-on-glass layer. All of the spin-on-glass layer within the well is removed through the plurality of openings. Thereafter, a second oxide layer is deposited overlying the first oxide layer and capping the plurality of openings thereby forming an air barrier within the well. A metal layer is deposited overlying the second oxide layer and patterned using the same inductor reticle to form the inductor in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention forms an air well at the substrate underlying the inductor. It is expected that the presence of the air well will reduce substantially the parasitic capacitance and series resistance.

Figure 1:
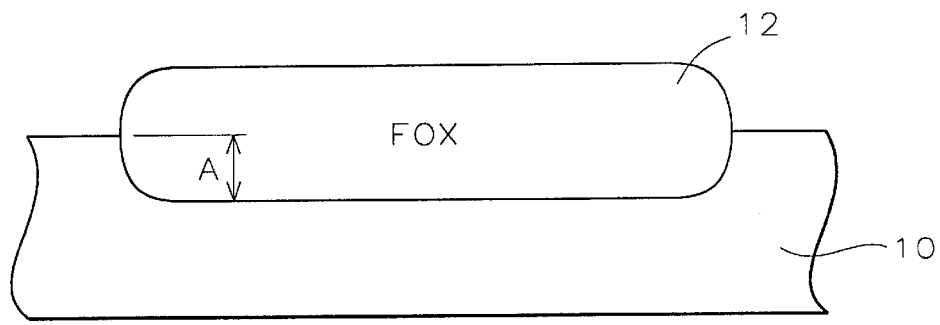
FIGS. 1 through 10 schematically illustrate in cross-sectional representation a preferred embodiment of the present invention.

Referring now to FIG. 1, there is shown a portion of a semiconductor substrate 10, preferably composed of monocrystalline silicon. In the first step to form an air well at the substrate underlying an inductor, a field oxide region 12 is formed in and on the semiconductor substrate 10 using a conventional local oxidation of silicon (LOCOS) process. The field oxidation should be performed so that the thickness A of the field oxide region into the substrate is between about 2000 and 5000 Angstroms.

Figure 2:
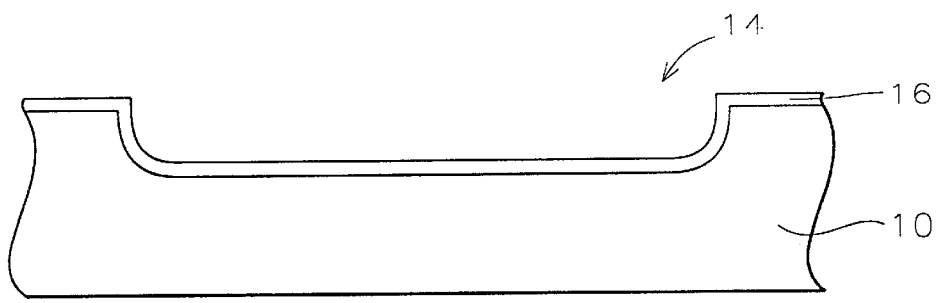

Next, as shown in FIG. 2, the field oxide region 12 is removed by wet etching, for example using a hydrofluoric acid solution, leaving a well 14 in the substrate. The depth of the well is between about 2000 and 5000 Angstroms. A thin layer of undoped silicate glass (USG) 16 is deposited over the surface of the substrate and lining the well, as shown. The USG layer 16 has a thickness of between about 1000 and 1500 Angstroms. Alternatively, this layer 16 may be a stacked nitride-oxide layer, for example 1000 Angstroms of nitride and 500 Angstroms of oxide, or layer 16 may be a thin thermally grown oxide.

Figure 3:
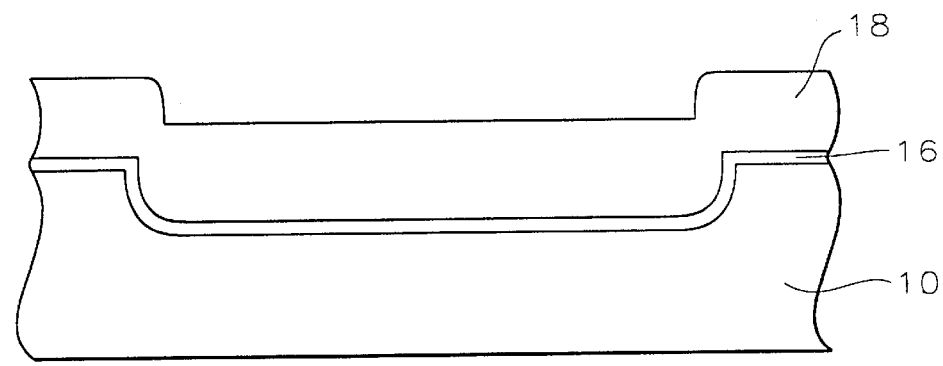

Referring now to FIG. 3, a spin-on-glass layer 18 is formed on the substrate and filling the well. The spin-on-glass layer is formed as is conventional in the art. That is, a spin-on-glass layer is coated over the wafer by a spin-on method and then baked and cured. The spin-on-glass layer 18 may be formed by multiple spin-on steps followed by baking and curing of the layers. The thickness of the final spin-on-glass film 18 may be between about 3000 and 6000 Angstroms.

Figure 4:
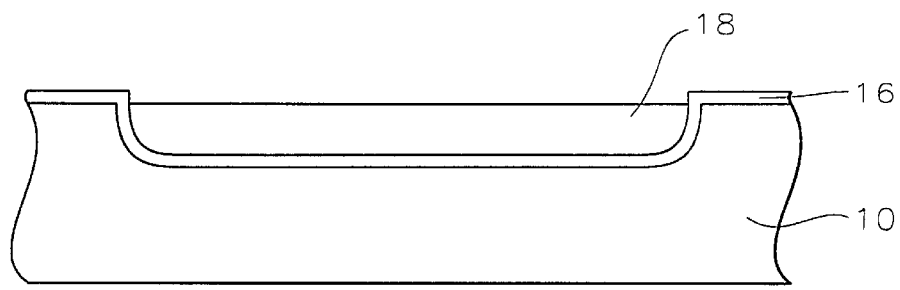

The spin-on-glass layer 18 is polished back, such as by chemical mechanical polishing (CMP). The USG (or other material) layer 16 acts as a polish stop. The remaining spin-on-glass layer 18 has a flat surface just below the surface of the USG layer 16, as shown in FIG. 4.

Figure 5:
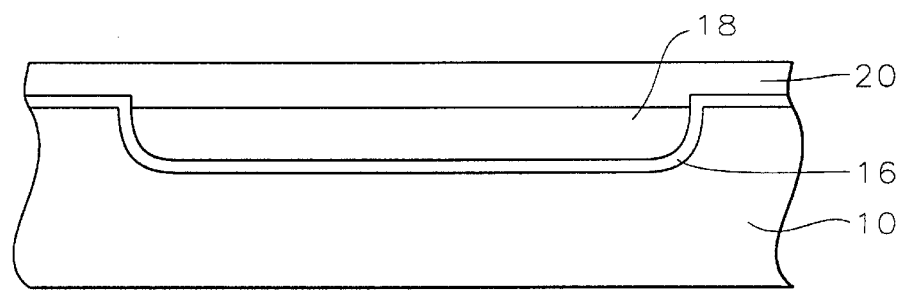

Referring now to FIG. 5, an oxide layer 20 is deposited by chemical vapor deposition (CVD) over the surface of the substrate and over the spin-on-glass-filled well 18. The oxide layer has a preferred thickness of between about 2000 and 3000 Angstroms.

Figure 6:
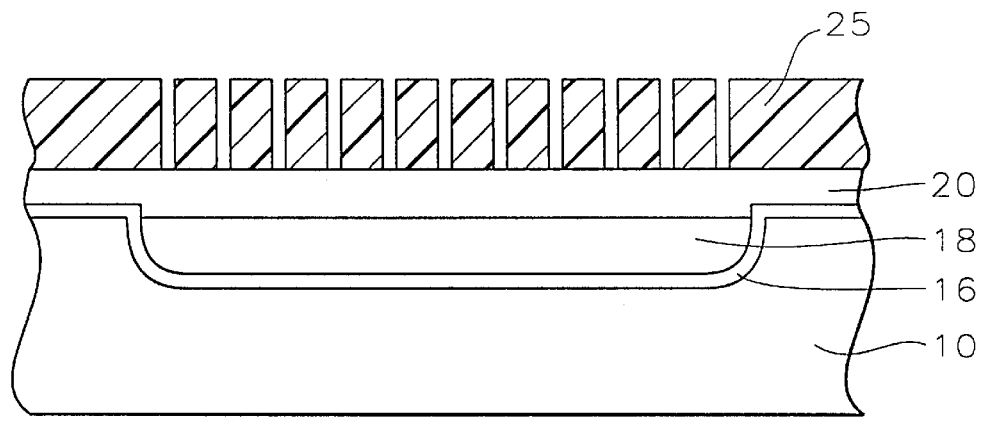

Next, a layer of photoresist is coated over the surface of the oxide layer 20. A photoresist mask 25 is formed over the oxide using the inductor reticle, as shown in FIG. 6.

Figure 7:
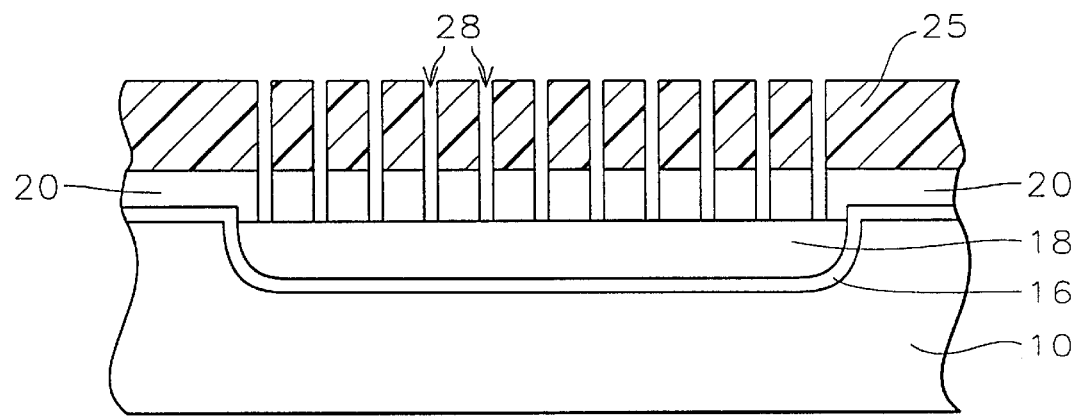

Referring to FIG. 7, the oxide 20 is etched through to the spin-on-glass layer 18 where the oxide layer is not covered by the photoresist mask 25 using a dry etching process. For example, etching chemistries may include $C_4F_8/Co$, $C_4F_8/CHF_3$, or $CHF_3/CF_4$.

Figure 8:
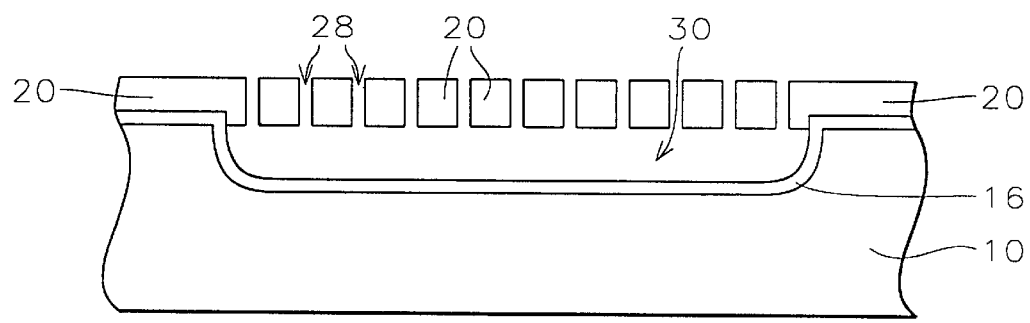

Referring now to FIG. 8, the photoresist mask 25 is stripped, for example, using a plasma reactive strip such as $O_2$ plasma and/or a chemical reactive strip such as $H_2SO_4/H_2O_2$. Now, the spin-on-glass 18 underlying the openings 28 within the oxide layer is removed using a dilute hydrofluoric acid (HF) solution having a selectivity of spin-on-glass to oxide of at least 100:1. After the spin-on-glass 18 has been removed from the well, only air 30 remains, as shown in FIG. 8.

Figure 9:
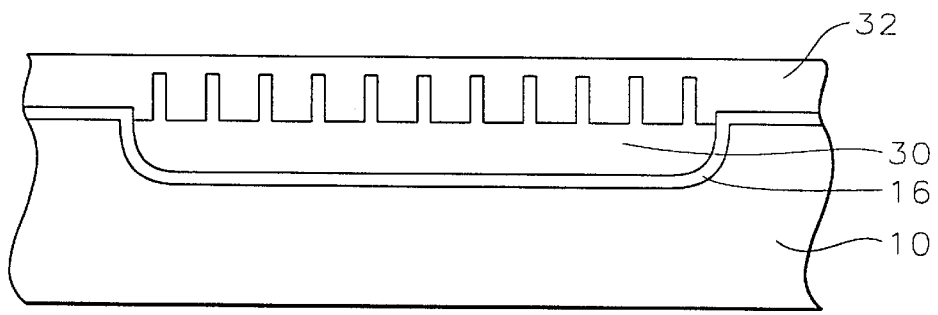

A thin oxide layer is deposited by chemical vapor deposition (CVD) over the oxide layer 20. This thin oxide layer, having a thickness of between about 500 and 2000 Angstroms, does not penetrate through the openings 28 into the air well 30. The oxide layer provides a cap over the openings 28 and together with the first oxide layer 20 forms the oxide layer 32 illustrated in FIG. 9. The thickness of the combined first and second oxide layers is between about 2500 and 5000 Angstroms. This completes formation of the air well 30 within the substrate.

Figure 10:
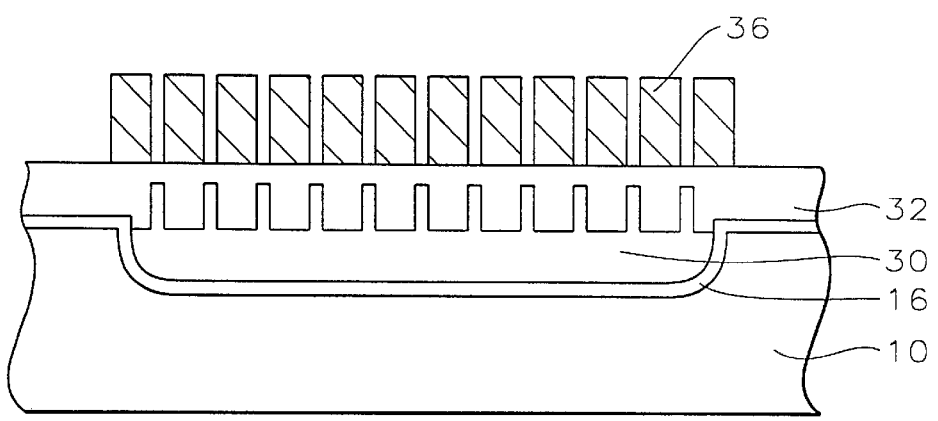

Now, as shown in FIG. 10, a layer of metal is deposited and patterned to form the inductor 36. The metal may be aluminum/copper or copper, for example, and have a thickness of between about 4000 and 10,000 Angstroms. The inductor 36 may either be a square or a circular spiral.

The process of the present invention provides a method for forming an air well in a silicon substrate underlying the inductor. This process does not involve micro-machining and is simple and compatible with existing processes. At a frequency of about 2 gigahertz (GHz), the inductor fabricated according to the process of the invention can have a quality factor (Q) as high as 6 to 7.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an inductor in the fabrication of an integrated circuit device comprising:

forming a field oxide region in and on a semiconductor substrate;

removing said field oxide region whereby a well is left in said semiconductor substrate;

depositing a polish stop layer over said substrate and within said well;

covering said polish stop layer and filling said well with a spin-on-glass layer;

polishing back said spin-on-glass layer to said polish stop layer;

depositing a first oxide layer overlying said spin-on-glass layer and said semiconductor substrate;

patterning said first oxide layer using an inductor reticle whereby a plurality of openings are made through said first oxide layer to said spin-on-glass layer;

removing all of said spin-on-glass layer within said well through said plurality of openings;

thereafter depositing a second oxide layer overlying said first oxide layer and capping said plurality of openings thereby forming an air barrier within said well; and depositing a metal layer overlying said second oxide layer and patterning said metal layer using same said inductor reticle to form said inductor in the fabrication of said integrated circuit.

2. The method according to claim 1 wherein said well has a depth of between about 2000 and 5000 Angstroms into said semiconductor substrate.

3. The method according to claim 1 wherein said polish stop layer comprises undoped silicon glass having a thickness of between about 1000 and 1500 Angstroms.

4. The method according to claim 1 wherein said polish stop layer comprises thermally grown silicon oxide.

5. The method according to claim 1 wherein said polish stop layer comprises a stacked silicon nitride/silicon oxide layer having a thickness of between about 1000 and 1500 Angstroms.

6. The method according to claim 1 wherein said first oxide layer is deposited to a thickness of between about 2000 and 3000 Angstroms.

7. The method according to claim 1 wherein said step of removing said spin-on-glass layer is performed using a dilute hydrofluoric acid solution having a selectivity of spin-on-glass to oxide of at least 100:1.

8. The method according to claim 1 wherein said second oxide layer is deposited to a thickness of between about 500 and 2000 Angstroms.

9. The method according to claim 1 wherein said metal layer comprises aluminum-copper and is deposited to a thickness of between about 4000 and 10,000 Angstroms.

10. The method according to claim 1 wherein said metal layer comprises copper and is deposited to a thickness of between about 4000 and 10,000 Angstroms.

11. The method according to claim 1 wherein said inductor has a square shape.

12. The method according to claim 1 wherein said inductor has a circular spiral shape.

13. A method of fabricating an inductor in the fabrication of an integrated circuit device comprising:

forming a field oxide region in and on a semiconductor substrate;

removing said field oxide region whereby a well is left in said semiconductor substrate;

depositing an undoped silicate glass layer over said substrate and within said well;

covering said undoped silicate glass layer and filling said well with a spin-on-glass layer;

polishing back said spin-on-glass layer to leave said spin-on-glass layer only within said well wherein said undoped silicate glass layer acts as a polish stop;

depositing a first oxide layer overlying said spinon-glass layer and said semiconductor substrate;

patterning said first oxide layer using an inductor reticle whereby a plurality of openings are made through said first oxide layer to said spin-on-glass layer;

removing all of said spin-on-glass layer within said well through said plurality of openings;

thereafter depositing a second oxide layer overlying said first oxide layer and capping said plurality of openings thereby forming an air barrier within said well; and depositing a metal layer overlying said second oxide layer and patterning said metal layer using same said inductor reticle to form said inductor in the fabrication of said integrated circuit.

14. The method according to claim 13 wherein said well has a depth of between about 2000 and 5000 Angstroms into said semiconductor substrate.

15. The method according to claim 13 wherein said undoped silicate glass layer has a thickness of between about 1000 and 1500 Angstroms.

16. The method according to claim 13 wherein said first oxide layer is deposited to a thickness of between about 2000 and 3000 Angstroms.

17. The method according to claim 13 wherein said step of removing said spin-on-glass layer is performed using a dilute hydrofluoric acid solution having a selectivity of spin-on-glass to oxide of at least 100:1.

18. The method according to claim 13 wherein said second oxide layer is deposited to a thickness of between about 500 and 2000 Angstroms.

19. The method according to claim 13 wherein said metal layer comprises one of the group containing aluminum-copper and copper and is deposited to a thickness of between about 4000 and 10,000 Angstroms.

20. The method according to claim 13 wherein said inductor has a square shape.

21. The method according to claim 13 wherein said inductor has a circular spiral shape.

22. A method of fabricating an inductor in the fabrication of an integrated circuit device comprising:

forming a field oxide region in and on a semiconductor substrate;

removing said field oxide region whereby a well is left in said semiconductor substrate;

depositing an undoped silicate glass layer over said substrate and within said well;

covering said undoped silicate glass layer and filling said well with a spin-on-glass layer;

polishing back said spin-on-glass layer to leave said spin-on-glass layer only within said well wherein said undoped silicate glass layer acts as a polish stop;

depositing a first oxide layer overlying said spinon-glass layer and said semiconductor substrate;

patterning said first oxide layer using an inductor reticle whereby a plurality of openings are made through said first oxide layer to said spin-on-glass layer;

removing all of said spin-on-glass layer within said well through said plurality of openings using a dilute hydrofluoric acid solution having a selectivity of spin-on-glass to oxide of at least 100:1;

thereafter depositing a second oxide layer overlying said first oxide layer and capping said plurality of openings thereby forming an air barrier within said well; and depositing a metal layer overlying said second oxide layer and patterning said metal layer using same said inductor reticle to form said inductor in the fabrication of said integrated circuit.

23. The method according to claim 22 wherein said well has a depth of between about 2000 and 5000 Angstroms into said semiconductor substrate.

24. The method according to claim 22 wherein the combined thickness of said first and second oxide layers is between about 2500 and 5000 Angstroms.

25. The method according to claim 22 wherein said inductor comprises one of the group containing aluminum-copper and copper and has a thickness of between about 4000 and 10,000 Angstroms and wherein said inductor has a circular spiral shape.

26. The method according to claim 22 wherein said tor comprises one of the group containing aluminum-copper and has a thickness of between about 4,000 and 10,000 Angstroms and wherein said inductor has a square shape.

* * * * *

UNITED STATES PATENT AND TRADEMARK OFFICE
CERTIFICATE OF CORRECTION

PATENT NO.     : 6,221,727 B1
DATED          : April 24, 2001
INVENTOR(S)    : Lap Chan, Johnny Kok Wai Chew, Cher Liang Cha and Chee Tee Chua It is certified that error appears in the above-identified patent and that said Letters Patent is hereby corrected as shown below:

<u>Title page,</u>
Item [73], please add -- National University of Singapore, Singapore, Singapore -- to the list of Assignees.

Signed and Sealed this

Twenty-third Day of July, 2002

*Attest:*

*Attesting Officer*

JAMES E. ROGAN
*Director of the United States Patent and Trademark Office*